(12) United States Patent
Torpey

(10) Patent No.: US 12,525,956 B2
(45) Date of Patent: *Jan. 13, 2026

(54) ACOUSTIC RESONATOR FILTER SYSTEM

(71) Applicant: NORTHROP GRUMMAN SYSTEMS CORPORATION, Falls Church, VA (US)

(72) Inventor: Matthew S. Torpey, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 280 days.

This patent is subject to a terminal disclaimer.

(21) Appl. No.: 18/181,708

(22) Filed: Mar. 10, 2023

(65) Prior Publication Data

US 2023/0299739 A1 Sep. 21, 2023

Related U.S. Application Data

(60) Provisional application No. 63/321,085, filed on Mar. 17, 2022.

(51) Int. Cl.
*H03H 9/54* (2006.01)
*H03H 9/205* (2006.01)

(52) U.S. Cl.
CPC ............ *H03H 9/542* (2013.01); *H03H 9/205* (2013.01)

(58) Field of Classification Search
CPC .... H03H 9/542; H03H 9/205; H03H 9/02007; H03H 2009/02188; H03H 2009/02196; H03H 2009/02204; H03H 7/004; H03J 7/04; H03J 7/08
USPC .................................. 333/187, 193; 455/197
See application file for complete search history.

(56) References Cited

U.S. PATENT DOCUMENTS

| | | | | |
|---|---|---|---|---|
| 3,626,300 A | * | 12/1971 | Kennedy | H03D 7/18 455/197.1 |
| 4,583,244 A | * | 4/1986 | Ecklund | H03J 7/08 381/15 |
| 5,004,989 A | * | 4/1991 | Hasler | H03B 5/1243 331/117 R |
| 7,522,016 B2 | * | 4/2009 | Toncich | H03H 9/76 333/133 |
| 2005/0212612 A1 | * | 9/2005 | Kawakubo | H03H 9/542 331/117 R |

(Continued)

FOREIGN PATENT DOCUMENTS

JP 2009-529833 A 8/2009

OTHER PUBLICATIONS

TWOA: Office Action issued Apr. 2, 2024 for corresponding Taiwan Patent Application No. 112109711. (Translation attached to OA).

(Continued)

*Primary Examiner* — Andrea Lindgren Baltzell
*Assistant Examiner* — Victor Cole
(74) *Attorney, Agent, or Firm* — Tarolli, Sundheim, Covell & Tummino LLP

(57) ABSTRACT

One example includes an acoustic resonator filter system. The system includes a filter element arranged between a low-voltage rail and a filter-path node through which an RF input signal propagates to provide a filtered RF output signal. The filter element includes an acoustic resonator and a capacitive network arranged in parallel with the acoustic resonator.

17 Claims, 2 Drawing Sheets

(56) References Cited

U.S. PATENT DOCUMENTS

| | | | | |
|---|---|---|---|---|
| 2014/0354512 A1* | 12/2014 | Kadota | ............... | H03H 9/542 |
| | | | | 343/904 |
| 2016/0065165 A1* | 3/2016 | Kadota | ............... | H03H 9/542 |
| | | | | 333/174 |
| 2016/0126922 A1* | 5/2016 | Leipold | ............ | H01F 27/2804 |
| | | | | 333/132 |
| 2016/0294357 A1* | 10/2016 | Tani | ................. | H03H 9/542 |
| 2017/0085290 A1 | 3/2017 | Khlat | | |
| 2017/0222628 A1 | 8/2017 | Darvishi et al. | | |
| 2021/0099151 A1 | 4/2021 | Burgener et al. | | |
| 2021/0111696 A1 | 4/2021 | Rinaldi et al. | | |
| 2022/0060177 A1 | 2/2022 | Sung et al. | | |
| 2022/0077848 A1 | 3/2022 | Yu et al. | | |

OTHER PUBLICATIONS

International Search Report and Written Opinion for corresponding PCT/US2023/014979, dated Jun. 21, 2023, pp. 1-10.

Hock Lim et al., "A study on tunable bulk acoustic wave macro resonators", In: 2016 IEEE Region 10 Conference (TENCON), Feb. 9, 2017, section II.

EESR: "Extended European Search Report" issued on Sep. 1, 2025 for corresponding EP 23771260.9.

Chen, et al.: "A1N Combined Overtone Resonators for the 5G mmWave Spectrum"; arxiv.org, Cornell University Library, 201 OLIN Library Cornell University Ithaca, NY 14853, Dec. 30, 2019 (Dec. 30, 2019), XP081548670; abstract Section V.

Hirano, et al.: "Integration of BST varactors with surface acoustic wave device by film transfer technology for tunable RF filters", Journal of Micromechanics and Microengineering, Institute of Physics Publishing, Bristol, GB, vol. 23, No. 2, Dec. 21, 2012 (Dec. 21, 2012), p. 25005, XP020237867, ISSN: 0960-1317, DOI:1031088/0960-1317/23/2/025005; abstract figures4, 5.

KROA Office Action issued for corresponding Korean application No. 10-2024-7034267 (Action plus translation attached).

* cited by examiner

ACOUSTIC RESONATOR FILTER SYSTEM

CROSS REFERENCE TO RELATED APPLICATION

This application claims priority from U.S. Provisional Patent Application No. 63/321,085, filed 17 Mar. 2022, which is incorporated herein by reference in its entirety.

TECHNICAL FIELD

The present disclosure relates generally to communications, and specifically to an acoustic resonator filter.

BACKGROUND

Resonator circuits are implemented in a variety of different types of applications, such as to filter ranges of frequencies. A variety of different types of resonators exist. One such type of resonator is an acoustic resonator that implements acoustic waves on an integrated circuit (IC). Acoustic resonators include bulk acoustic wave (BAW) resonators and standing acoustic wave (SAW) resonators. Acoustic wave resonators are designed to provide confinement of the acoustic energy in the resonator to increase quality factor (Q) of the resonator. As an example, conventional acoustic resonators can provide for effective filtering in a narrow band about a center frequency (e.g., +/− approximately 5 dB).

One example includes an acoustic resonator filter system. The system includes a filter element arranged between a low-voltage rail and a filter-path node through which an RF input signal propagates to provide a filtered RF output signal. The filter element includes an acoustic resonator and a capacitive network arranged in parallel with the acoustic resonator.

Another example includes an acoustic resonator filter system. The system includes a plurality of filter elements. Each of the filter elements can be arranged between a low-voltage rail and one of a plurality of filter-path nodes through which an RF input signal propagates to provide a filtered RF output signal. The acoustic resonator filter system is arranged as a resonator tank network. Each of the filter elements includes an acoustic resonator and a capacitive network arranged in parallel with the acoustic resonator.

Another example includes an integrated circuit (IC) that includes an acoustic resonator filter system. The system includes a plurality of filter elements. Each of the filter elements can be arranged between a low-voltage rail and one of a plurality of filter-path nodes through which an RF input signal propagates to provide a filtered RF output signal. The acoustic resonator filter system is arranged as a resonator tank network. Each of the filter elements includes an acoustic resonator and a capacitive network arranged in parallel with the acoustic resonator.

DETAILED DESCRIPTION

The present disclosure relates generally to communications, and specifically to an acoustic resonator filter system. The acoustic resonator filter system can be implemented in any of a variety of communications systems, such as in a transmit and/or a receive path of a wireless transceiver, or in a variety of variable filter applications. The acoustic resonator filter system includes a plurality of filter elements that each include an acoustic resonator and a capacitive network. As an example, the acoustic resonator can be configured as a combined overtone resonator (COR), a bulk acoustic wave (BAW) resonator, or another type of acoustic resonator. As another example, the capacitive network can include at least one capacitor provided in parallel with the acoustic resonator. For example, the capacitor(s) can include a fixed capacitor and a variable capacitor (varactor), such as a barium strontium titanate (BST) varactor, configured to provide a variable capacitance.

As an example, the filter elements can each be arranged between one of a plurality of filter-path nodes and a low-voltage rail (e.g., ground). Therefore, the acoustic resonator filter system can be arranged as a resonator tank network. As an example, each of the filter-path nodes can be coupled by a plurality of filter-path capacitors. The physical characteristics of the acoustic resonators, the capacitance of the capacitive network, and the capacitance of the filter-path capacitors can be arranged to tune the filter characteristics of the acoustic resonator filter system. Therefore, an RF input signal that is provided through a signal path that includes each of the filter-path nodes and the filter-path capacitors can be provided as an RF output signal that is filtered by the acoustic resonator filter system. Based on the arrangement of the filter elements that include an acoustic resonator and a capacitive network in parallel, the acoustic resonator filter system can achieve a significantly larger bandwidth (e.g., up to 25%) relative to a typical acoustic resonator filter. The arrangement of the acoustic resonator filter system as a resonator tank network with respect to the filter elements can thus provide for a significantly improved filter system than a typical filter that includes acoustic resonators in a ladder network.

Figure 1:
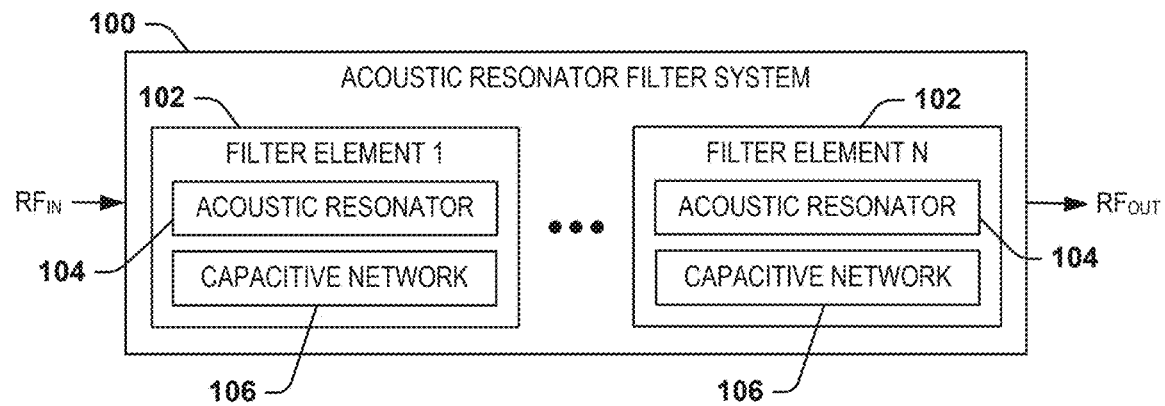
FIG. 1 illustrates an example block diagram of an acoustic resonator filter system.

FIG. 1 illustrates an example block diagram of an acoustic resonator filter system 100. The acoustic resonator filter system can be implemented in any of a variety of communications systems, such as in a transmit and/or a receive path of a wireless transceiver, or as a filter block for a larger selective filter system. As described herein, the acoustic resonator filter system can provide pass-band filtering of a radio frequency (RF) input signal, demonstrated in the example of FIG. 1 as a signal $RF_{IN}$. As an example, the acoustic resonator filter system 100 can be fabricated in an integrated circuit (IC).

The acoustic resonator filter system 100 includes a plurality N of filter elements 102. Each of the filter elements 102 includes an acoustic resonator 104 and a capacitive network 106. As an example, the acoustic resonator 104 can be configured as a combined overtone resonator (COR), a bulk acoustic wave (BAW) resonator, or any of a variety of other types of acoustic resonators. The capacitive network 106 can be arranged in parallel with the acoustic resonator 104. The arrangement and characteristics of the acoustic resonator 104 and capacitive network 106 in each of the filter elements can provide for a pass-band of the respective one of the filter elements 102 that can provide for a large bandwidth (e.g., up to approximately 25%) of the pass-band provided by the respective filter element 102. Thus, the RF input signal $RF_{IN}$ can be filtered at the respective pass-band and provided as an RF output signal $RF_{OUT}$.

As an example, the filter elements 102 can each be arranged between one of a plurality of filter-path nodes and a low-voltage rail (e.g., ground). Therefore, the acoustic resonator filter system 100 can be arranged as a resonator tank network. As an example, each of the filter-path nodes can be coupled by a plurality of filter-path capacitors. The physical characteristics of the acoustic resonators 104 and the capacitance values of the capacitive networks 106 of the respective filter elements 102 can be set to tune the filter characteristics of the acoustic resonator filter system 100. The arrangement of the acoustic resonator filter system 100 as a resonator tank network with respect to the filter elements 102 can thus provide for a significantly improved filter system than a typical filter system that includes acoustic resonators in a ladder network.

Figure 2:
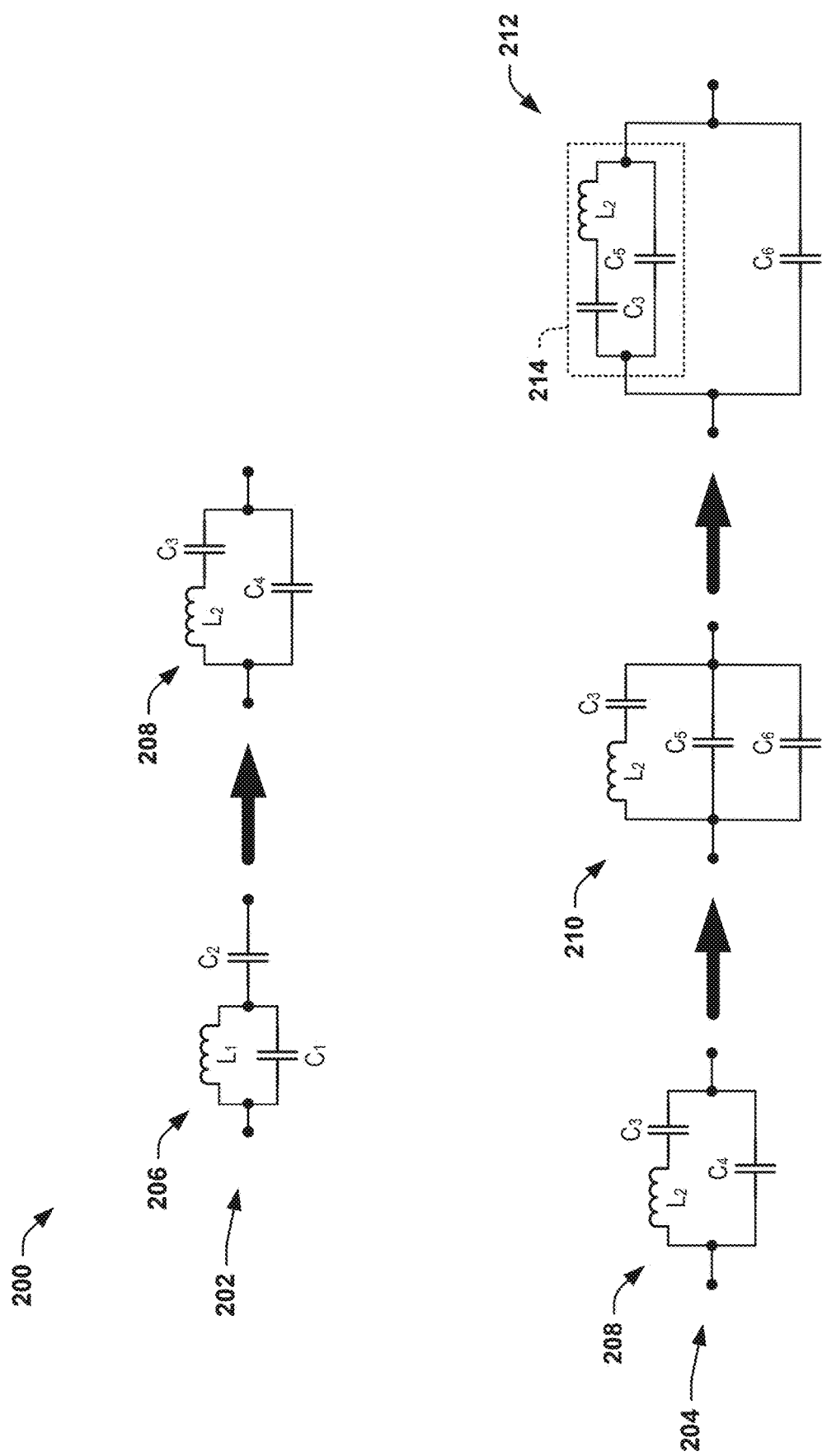
FIG. 2 illustrates an example diagram of dipole transforms of filter elements.

FIG. 2 illustrates an example diagram 200 of dipole transforms of filter elements. The diagram 200 demonstrates a first dipole transform 202 and a second dipole transform 204. The dipole transforms 202 and 204 can correspond to the formation of a filter element, such as one of the filter elements 102 of the example of FIG. 1. Therefore, reference is to be made to the example of FIG. 1 in the following description of the example of FIG. 2.

The first dipole transform 202 demonstrates a first resonator dipole 206. The first resonator dipole 206 includes an inductor $L_1$ in parallel with a capacitor $C_1$, with the parallel arrangement of the inductor $L_1$ and the capacitor $C_1$ in series with a capacitor $C_2$. The first dipole transform 202 demonstrates a second resonator dipole 208 that is equivalent to the first resonator dipole 206. The second resonator dipole 208 includes an inductor $L_2$ in series with a capacitor $C_3$, with the series arrangement of the inductor $L_2$ and the capacitor $C_3$ in parallel with a capacitor $C_4$. For example, the equivalency between the first and second resonator dipoles 208 and 210 can be based on an approximately same performance over frequency (e.g., including poles and zeroes) based on tuning the values of the inductors $L_1$ and $L_2$, as well as the capacitors $C_1$ through $C_4$.

The second dipole transform 204 demonstrates the second resonator dipole 208, and a third resonator dipole 210 that is approximately equivalent to the second resonator dipole 208. The third resonator dipole 210 is arranged similar to the second dipole 208, but the capacitor $C_4$ is split into a parallel set of capacitors $C_5$ and $C_6$. Similar to as described above in the second dipole transform 204, the equivalency between the second and third resonator dipoles 208 and 210 can correspond to a nominal performance over frequency (e.g., including poles and zeroes) based on tuning the values of the inductors $L_1$ and $L_2$, as well as the capacitors $C_1$, $C_5$, and $C_6$. However, by tuning the capacitance values of the parallel set of capacitors $C_5$ and $C_6$, the bandwidth of the third resonator dipole 210 can be tuned to a much larger percentage about the frequency pole than by implementing the capacitor $C_4$ alone.

The second dipole transform 204 also demonstrates a fourth resonator dipole 212 that is approximately equivalent to the third resonator dipole 210. The fourth resonator dipole 212 is arranged similar to the third dipole 210, but the capacitor $C_5$ is arranged in parallel with the series arrangement of the inductor $L_2$ and the capacitor $C_5$. The arrangement of the inductor $L_2$ and the capacitors $C_2$ and $C_5$ can thus correspond to an acoustic resonator dipole equivalent circuit, demonstrated at 214. The arrangement of the acoustic resonator dipole 214 can be representative of operational characteristics of the associated acoustic resonator. For example, the inductance value of the inductor $L_2$, the capacitance value of the capacitor $C_3$, and the capacitance value of the capacitor $C_5$ can be based on physical characteristics (e.g., substrate dimensions) of the associated acoustic resonator.

Therefore, similar to as described above regarding the third resonator dipole 210, by incorporating the capacitor $C_6$ in parallel with an acoustic resonator (e.g., the acoustic resonator dipole 214), the associated fourth dipole 212 can achieve a bandwidth having a significantly larger percentage about the associated frequency pole the acoustic resonator dipole 214 alone. Accordingly, the fourth resonator dipole 212 can be implemented as a filter element in an acoustic resonator filter system, such as the acoustic resonator filter system 100 in the example of FIG. 1, to provide significantly greater performance than a conventional filter system that implements acoustic resonators.

Figure 3:
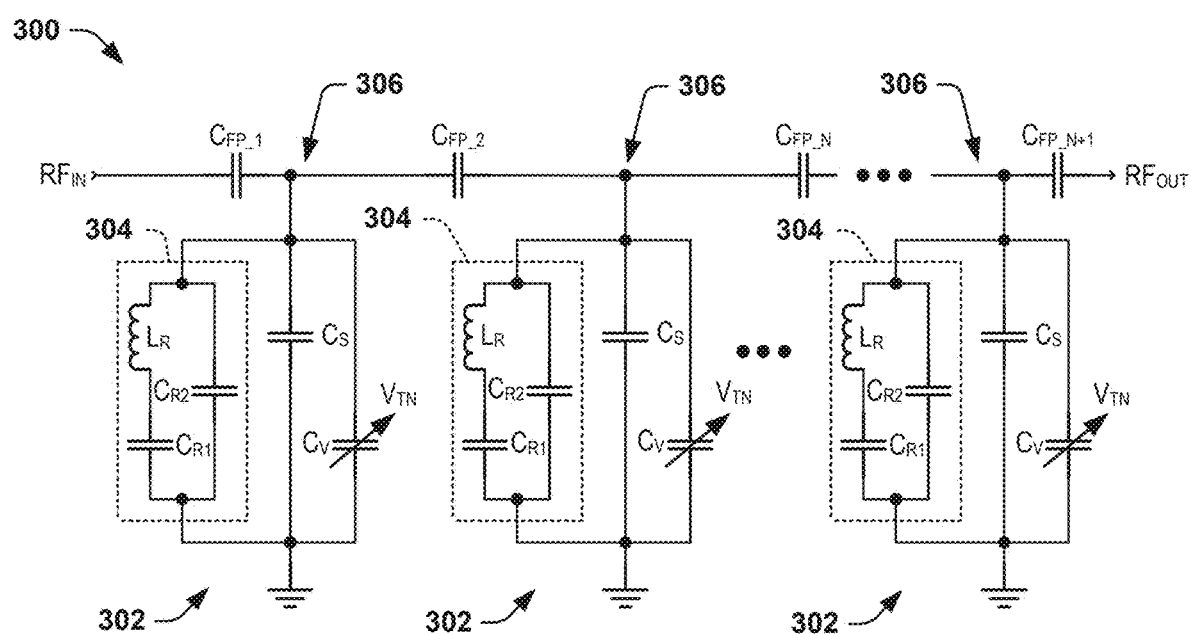
FIG. 3 illustrates an example diagram of an acoustic resonator filter system.

FIG. 3 illustrates an example diagram of an acoustic resonator filter system 300. The acoustic resonator filter system 300 can correspond to the acoustic resonator filter system 100 in the example of FIG. 1. Therefore, reference is to be made to the example of FIG. 1 in the following description of the example of FIG. 3.

The acoustic resonator filter system 300 includes a plurality N of filter elements 302, where N is a positive integer. Each of the filter elements 302 includes an acoustic resonator 304, a capacitor $C_S$, and another capacitor $C_V$ arranged in parallel. The filter elements 302 can be arranged similar to the fourth resonator dipole 212 in the example of FIG. 2, such that the parallel arrangement of the capacitors $C_S$ and $C_V$ can correspond to the capacitor $C_6$. In the example of FIG. 3, the capacitor is demonstrated as a variable capacitor (varactor), such that a voltage $V_{TN}$ could be provided to set the capacitance of the capacitor $C_V$. Alternatively, the capacitor $C_V$ could have a fixed capacitance, or the capacitors $C_S$ and $C_V$ could be combined into a single equivalent capacitance (e.g., similar to the capacitor $C_6$).

The acoustic resonator 304 is demonstrated in the example of FIG. 3 as an acoustic resonator dipole including a first capacitor $C_{R1}$ and an inductor $L_R$ arranged in series, with the series arrangement of the first capacitor $C_{R1}$ and the inductor $L_R$ being arranged in parallel with a second capacitor $C_{R2}$. The acoustic resonator 304 is therefore arranged similar to the acoustic resonator dipole 214 in the example of FIG. 2. The arrangement of the acoustic resonator 304 can be representative of operational characteristics of the acoustic resonator 304. For example, the values of the first capacitor $C_{R1}$, the second capacitor $C_{R2}$, and the inductor $L_R$ can be based on physical characteristics (e.g., substrate dimensions) of the acoustic resonator 304. The filter elements 302 can be arranged in a symmetrical manner with respect to the first, last, and intermediate filter elements 302 to provide appropriate impedance matching and filter matching characteristics.

As an example, the acoustic resonator 304 can be configured as a COR (e.g., an aluminum nitride (AlN) COR). Therefore, the acoustic resonators 304 can exhibit a high quality factor (Q) at frequencies both above and below a given range of frequencies of the RF input signal $RF_{IN}$ (e.g., Ka-band). For example, the CORs can operate at a Q between approximately 400 and approximately 1000. Additionally, the acoustic resonators 304 configured as CORs can provide a shape factor selectivity of approximately 1.03 to provide significant out-of-band and interference rejection of the RF input signal $RF_{IN}$. Such a selectivity can achieve a rejection of approximately 60 dB at approximately 50 MHz on either side of a 3.5 GHz bandwidth, thus providing a significantly greater rejection characteristic of conventional acoustic resonator filters (e.g., exhibiting a selectivity of approximately 1.5).

The parallel arrangement of the acoustic resonator 304, the capacitor $C_S$, and the capacitor $C_V$ can provide for significantly improved filter characteristics over conventional filters. For example, the split capacitance provided by the capacitors $C_S$ and $C_V$ in parallel with the acoustic resonator 304 can provide for the ability to tune of the filter element 302 over a broad frequency range with minimal impact to quality factor Q and insertion loss. As an example, the capacitor $C_V$ can be configured as a barium strontium titanate (BST) varactor, thus enabling a tuning range of approximately 33% with a loss tangent of approximately 0.006 and a quality factor Q of approximately 40 at a frequency of approximately 18 GHz. Therefore, the split capacitor arrangement of the capacitors $C_S$ and $C_V$ in parallel with the acoustic resonator 304 can provide for a large range of frequency tuning without providing performance degradation of the acoustic resonator filter system 300.

In the example of FIG. 3, each of the filter elements 302 is arranged between a filter-path node 306 and a low-voltage rail, demonstrated in the example of FIG. 3 as ground. Each of the filter-path nodes 306 interconnects a pair of filter-path capacitors, demonstrated in the example of FIG. 3 as capacitors $C_{FP\_1}$ through $C_{FP\_N+1}$ for the set of N filter elements. Therefore, the filter-path capacitors $C_{FP\_1}$ through $C_{FP\_N+1}$ number one greater in quantity than the N filter elements 302. Therefore, the acoustic resonator filter system 300 is arranged as a resonator tank network to filter the RF input signal $RF_{IN}$. The RF input signal $RF_{IN}$ is provided in a signal path through the filter-path capacitors $C_{FP\_1}$ through $C_{FP\_N+1}$ and the filter-path nodes 306 to provide the RF output signal $RF_{OUT}$. Therefore, based on the arrangement of the filter elements 302 between the filter-path capacitors $C_{FP\_1}$ through $C_{FP\_N+1}$, the acoustic resonator filter system 300 is configured to provide one or more pass-bands (e.g., harmonically related passbands). As an example, a given pass-band of the acoustic resonator filter system 300 can have a bandwidth up to approximately 25%. By contrast, a conventional filter system that includes an acoustic resonator can have a bandwidth of less than 5%. Therefore, the acoustic resonator filter system 300 can provide a significant benefit over a typical filter system that includes an acoustic resonator.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An acoustic resonator filter system comprising a filter element arranged between a low-voltage rail and a filter-path node through which an RF input signal propagates to provide a filtered RF output signal, the filter element comprising:
   an acoustic resonator; and
   a capacitive network arranged in parallel with the acoustic resonator, wherein the capacitive network comprises a first capacitor arranged in parallel with the acoustic resonator and a second capacitor arranged in parallel with the acoustic resonator and the first capacitor.

2. An integrated circuit (IC) comprising the acoustic resonator filter system of claim 1.

3. The system of claim 1, wherein the second capacitor is arranged as a varactor that is configured to provide a variable capacitance in response to a control voltage.

4. The system of claim 3, wherein the varactor is arranged as a barium strontium titanate (BST) varactor.

5. The system of claim 1, wherein the filter element is a first filter element of a plurality of filter elements, each of the filter elements being arranged between one of a plurality of filter-path nodes and the low-voltage rail, such that the acoustic resonator filter system is arranged as a resonator tank network.

6. The system of claim 5, further comprising a plurality of filter-path capacitors, each of the filter-path capacitors being coupled between a pair of the filter-path nodes, such that the RF input signal propagate through each of the filter-path capacitors and each of the filter-path nodes.

7. The system of claim 1, wherein the acoustic resonator comprises one or more physical characteristics and wherein the capacitive network comprises a capacitance value, wherein the one or more physical characteristics and the capacitance value are selected to set one or more characteristics associated with the acoustic resonator filter system.

8. The system of claim 1, wherein the acoustic resonator is arranged as a combined overtone resonator (COR).

9. An acoustic resonator filter system comprising a plurality of filter elements, each of the filter elements being arranged between a low-voltage rail and one of a plurality of filter-path nodes through which an RF input signal propagates to provide a filtered RF output signal, such that the acoustic resonator filter system is arranged as a resonator tank network, each of the filter elements comprising:
   an acoustic resonator; and
   a capacitive network arranged in parallel with the acoustic resonator, wherein the capacitive network comprises a first capacitor arranged in parallel with the acoustic resonator and a second capacitor arranged in parallel with the acoustic resonator and the first capacitor.

10. The system of claim 9, wherein the acoustic resonator comprises one or more physical characteristics and wherein the capacitive network comprises a capacitance value, wherein the one or more physical characteristics and the capacitance value are selected to set one or more characteristics associated with the acoustic resonator filter system.

11. An integrated circuit (IC) comprising the acoustic resonator filter system of claim 9.

12. The system of claim 9, wherein the second capacitor is arranged as a varactor that is configured to provide a variable capacitance in response to a control voltage.

13. The system of claim 9, further comprising a plurality of filter-path capacitors, each of the filter-path capacitors being coupled between a pair of the filter-path nodes, such that the RF input signal propagate through each of the filter-path capacitors and each of the filter-path nodes.

14. An integrated circuit (IC) comprising an acoustic resonator filter system, the acoustic resonator filter system comprising a plurality of filter elements, each of the filter elements being arranged between a low-voltage rail and one of a plurality of filter-path nodes through which an RF input signal propagates to provide a filtered RF output signal, such that the acoustic resonator filter system is arranged as a resonator tank network, each of the filter elements comprising:
- an acoustic resonator; and
- a capacitive network arranged in parallel with the acoustic resonator, wherein the capacitive network comprises a first capacitor arranged in parallel with the acoustic resonator and a second capacitor arranged in parallel with the acoustic resonator and the first capacitor.

15. The IC of claim 14, wherein the second capacitor is arranged as a varactor that is configured to provide a variable capacitance in response to a control voltage.

16. The IC of claim 14, wherein the acoustic resonator comprises one or more physical characteristics and wherein the capacitive network comprises a capacitance value, wherein the one or more physical characteristics and the capacitance value are selected to set one or more characteristics associated with the acoustic resonator filter system.

17. The IC of claim 14, wherein the acoustic resonator is arranged as a combined overtone resonator (COR).

* * * * *